US007629627B2

(12) United States Patent
Mil'shtein et al.

(10) Patent No.: US 7,629,627 B2
(45) Date of Patent: Dec. 8, 2009

(54) FIELD EFFECT TRANSISTOR WITH INDEPENDENTLY BIASED GATES

(75) Inventors: Samson Mil'shtein, Chelmsford, MA (US); John F. Palma, Dedham, MA (US)

(73) Assignee: University of Massachusetts, Shrewsbury, MA (US)

( * ) Notice: Subject to any disclaimer, the term of this patent is extended or adjusted under 35 U.S.C. 154(b) by 273 days.

(21) Appl. No.: 11/406,838

(22) Filed: Apr. 18, 2006

(65) Prior Publication Data

US 2007/0241368 A1    Oct. 18, 2007

(51) Int. Cl.
*H01L 31/0328* (2006.01)
*H01L 31/0336* (2006.01)
*H01L 31/072* (2006.01)
*H01L 31/109* (2006.01)
(52) U.S. Cl. .................. 257/192; 257/191; 257/194
(58) Field of Classification Search .................. 257/192, 257/191, 194
See application file for complete search history.

(56) References Cited

U.S. PATENT DOCUMENTS 3,714,522 A * 1/1973 Komiya et al. .............. 359/321

2006/0163594 A1 * 7/2006 Kuzmik ........................ 257/94

OTHER PUBLICATIONS

A. Chini, D. Buttari, R. Coffie, L. Shen, S. Heilman, A. Chakraborty, S. Keller, and U. K. Mishra, "Power and Linearity Characteristics of Field-Plated Recessed-Gate AlGaN—GaN HEMTs," *IEEE Electr. Dev. Lett.*, May 2004, pp. 229-231, vol. 25, No. 5.
Y. Hori, M. Kuzuhara, Y. Ando, and M. Mizuta, "Analysis of Electric Field Distribution in GaAs Metal-Semiconductor Field Effect Transistor with a Field-Modulating Plate," *J. Appl. Phys.*, Apr. 1, 2000, pp. 3483-3487, vol. 87, No. 7.
S. Karmalkar and G. Ramesh, "A Simple Yet Comprehensive Unified Physical Model of the 2-D Electron Gas in Delta-Doped and Uniformly Doped High Electron Mobility Transistors," *IEEE Trans. Electr. Dev.*, Jan. 2000, pp. 11-23, vol. 47 No. 1.
S. Karmalkar, J. Deng, M. S. Shur, and R. Gaska, RESURF AlGaN/GaN HEMT for High Voltage Power Switching, *IEEE Electr. Dev. Lett.*, Aug. 2001, pp. 373-375, vol. 22, No. 8.
S. Mil'shtein, "Novel Phenomena in Transistor with Tailored Field," 21$^{st}$ Int. Conf. Phys. Semicond., Aug. 10-14, 1992, pp. 1278-1281, vol. 2, *World Scientific*, Singapore.

(Continued)

*Primary Examiner*—Phat X Cao
(74) *Attorney, Agent, or Firm*—Wolf, Greenfield & Sacks, P.C.

(57) ABSTRACT

A field effect transistor (FET) having at least two independently biased gates can provide uniform electric field in the channel region of the FET. The same AC voltage may be applied to each gate for modulating the FET. One of the gates is positioned closer to the channel region than the other gate. Such a FET allows tailoring the electric field in the channel region of the FET so that it is substantially uniform. The FET exhibits desirable performance characteristics, including having a constant transconductance.

20 Claims, 6 Drawing Sheets

OTHER PUBLICATIONS

S. Mil'shtein and S. Sui, "Study of 2DEG in MOSFET with Tailored Field," *Proc. 25th Int. Conf. Phys. Semicond.*, Sep. 17-22, 2000, pp. 1755-1756.

S. Mil'shtein, P. Ersland, S. Somisetty, and C. Gil, "p-HEMT with Tailored Field," *Microelectronics J.*, 2003, pp. 359-361, vol. 34.

S. Mil'shtein and J. Palma, "Heterostucture Transistor with Tunable Gate Bias," *Microelectronics J.*, 2005, pp. 301-303, vol. 36.

J. Roig, D. Flores, J. Rebollo, S. Hidalgo, and J. Millan, "A 200 V Silicon-On-Sapphire LDMOS Structure With A Step Oxide Extended Field Plate," *Solid State Electr.*, 2004, pp. 245-252, vol. 48.

Y.-F. Wu, A. Saxler, M. Moore, R. P. Smith, S. Sheppard, P. M. Chavarkar, T. Wisleder, U. K. Mishra and P. Parikh, "30-W/mm GaN HEMTs by Field Plate Optimization," *IEEE Electr. Dev. Lett.*, Mar. 2004, pp. 117-119, vol. 25, No. 3.

H. Xing, Y. Dora, A. Chini, S. Heikman, S. Keller, and U. K. Mishra, "High Breakdown Voltage AlGaN—GaN HEMTs Achieved by Multiple Field Plates," *IEEE Electr. Dev. Lett.*, Apr. 2004, pp. 161-163, vol. 25, No. 4.

\* cited by examiner

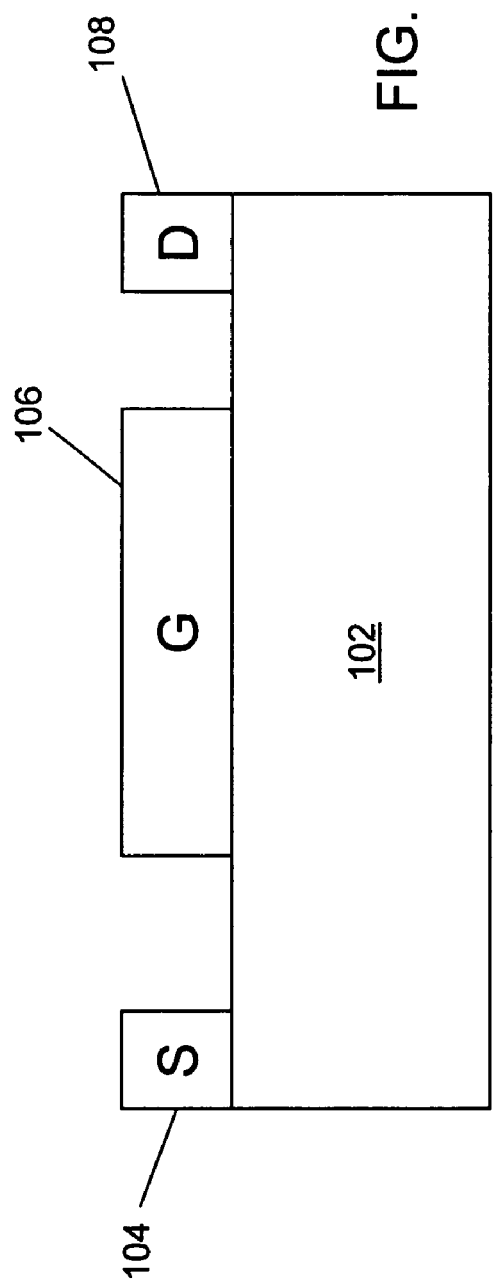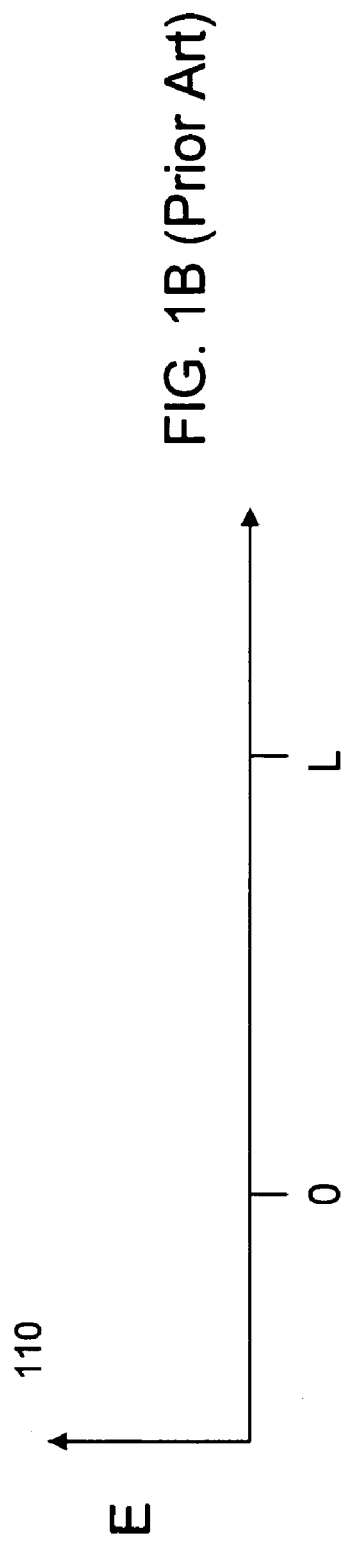
FIG. 1A (Prior Art)
FIG. 1B (Prior Art)

US 7,629,627 B2

FIELD EFFECT TRANSISTOR WITH INDEPENDENTLY BIASED GATES

BACKGROUND OF INVENTION

Field effect transistors (FETs) are semiconductor devices used in a wide variety of electronics applications. A FET has three terminals: a source, a drain and a gate. During operation of the FET, current flows between source and drain terminals through a channel region. The gate electrode, positioned between the source and the drain, enables the current through the FET to be controlled based on the strength of the signal applied to the gate. The signal and bias present at the gate, source and drain determines the electric field profile in the channel region between the source and the drain. The performance of the FET, e.g., factors such as current gain, carrier mobility, and transconductance ($g_m$), are determined by the profile of the electric field in the channel region.

In conventional FETs, the strength of the electric field varies over the length of the channel, being typically weaker near the source and stronger near the drain (in depletion mode). A non-uniform field can lead to decreased performance of the FET, because electrons near the source are accelerated slowly due to the relatively weak field in this region. Electrons near the drain may acquire too much energy due to the relatively strong field in this region, possibly causing damage to a gate insulator. An excessively strong electric field in one region can cause mobility degradation, hot electrons and impact ionization, and can generate gate leakage. FIG. 1A illustrates an example of a conventional metal semiconductor field effect transistor (MESFET) having a source 104, drain 106 and gate 108 formed on a substrate 102. FIG. 1B shows a curve 110 that illustrates an example of the magnitude of the electric field E in the channel region while the MESFET is in depletion mode. In this example, the magnitude of the electric field is relatively weak near the source and relatively strong near the drain. A non-uniform electric field, such as that illustrated by curve 110, can lead to decreased carrier mobility, non-linearity and non-constant transconductance.

Various techniques have been used to mitigate the effect of the non-uniform electric field, such as using a lightly-doped drain, delta doping of the channel, or using one or more field plates behind the gate. However, these methods lack flexibility to tailor the field in response to a range of operational voltages on the gate of the FET. Furthermore, no known field effect transistor provides constant transconductance.

SUMMARY OF INVENTION

Embodiments of the invention relate to tailoring the electric field in the channel region of a FET by appropriately positioning and biasing at least two gates of the FET. In accordance with the invention, each of the gates may be biased independently. For example, the same AC voltage may be applied to each gate, but each gate may biased at a different DC voltage. In one aspect of the invention, the electric field may be tailored by positioning one of the gates closer to the channel than the other gate. Using a FET with independently biased gates may enable providing a uniform electric field in the channel region of the FET. Furthermore, such a device may exhibit substantially constant transconductance, a high degree of linearity, and high breakdown, i.e., Early voltage. Constant transconductance provides a high degree of linearity, which can be particularly beneficial for amplifier applications in which linearity across a broad range of gate voltages is desirable.

One embodiment of the invention relates to a field effect transistor that operates with substantially constant transconductance.

Another embodiment of the invention relates to a field effect transistor that includes a channel region, a first gate biased at a first DC voltage, and a second gate biased at a second DC voltage and positioned farther from the channel region than the first gate.

A further embodiment of the invention relates to a field effect transistor that includes a source, a drain and a semiconductor region. The field effect transistor also includes a first gate biased at a first DC voltage and contacting the semiconductor region. The field effect transistor further includes a second gate biased at a second DC voltage lower than the first DC voltage. The second gate is separated from the semiconductor region by an insulating region.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A is a cross-section of a conventional MESFET;

FIG. 1B is a diagram showing a curve that illustrates the magnitude of the electric field in the channel region of the MESFET illustrated in FIG. 1A;

DETAILED DESCRIPTION

In accordance with some embodiments of the invention, a FET having at least two independently biased gates enables tailoring the electric field in the channel region of the FET. One of the gates may be positioned closer to the channel than the other gate. Using such a configuration, the electric field may be tailored so that it is substantially uniform in the channel region, which can improve the performance of the FET. For example, the FET can achieve substantially constant transconductance. Embodiments of the invention may be useful in a variety of amplifiers, mixers, switches or any other suitable circuits.

Figure 2:
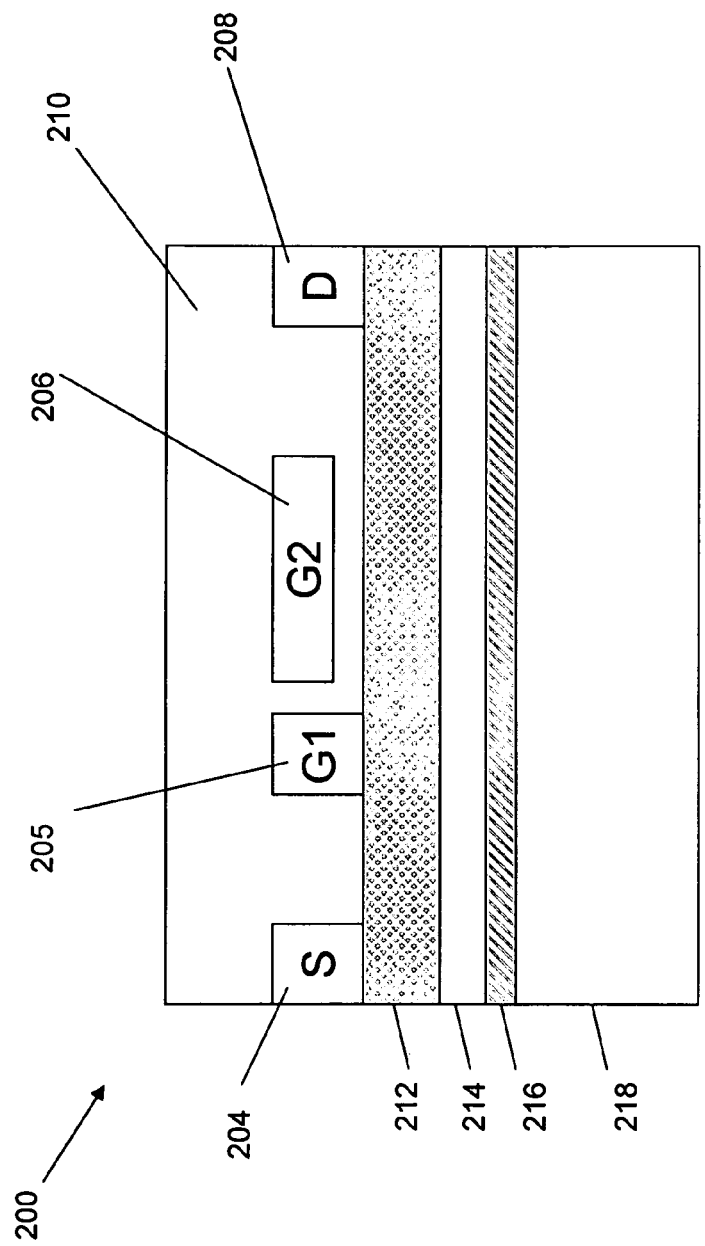
FIG. 2 is a cross-section of a pseudomorphic high-electron-mobility transistor (pHEMT) according to one embodiment of the invention.

FIG. 2 is a cross-section of a pseudomorphic high-electron-mobility transistor (pHEMT) according to one embodiment of the invention. In this embodiment, pHEMT 200 includes a source 204, drain 208, a first gate 205 and a second gate 206. Source 204, drain 208, first gate 205 and second gate 206 may be metallizations formed of any suitable material, e.g., a metal such as aluminum. Source 204, drain 208, first gate 205 and second gate 206 may be separated by an insulating region 210 which may be any suitable insulating material such as silicon nitride or silicon dioxide. Insulating region 210 may include one material or a combination of materials, as the invention is not limited in this respect. In this embodiment, pHEMT 200 includes a first semiconductor layer 212, e.g., gallium arsenide (GaAs), a second semiconductor layer 214, e.g., aluminum gallium arsenide (AlGaAs), a channel region 216, e.g., indium gallium arsenide (InGaAs), and a substrate 218. The materials described herein are provided merely by way of illustration, as the invention is not limited to any particular types of materials.

First gate 205 may form a Schottky contact with first semiconductor layer 212, and may be closer to source 204 than second gate 206. Second gate 206 may be separated from first semiconductor layer 212 by insulating region 210, and may be closer to drain 208 than first gate 205. In this embodiment, second gate 206 may be wider than first gate 205. First gate 205 and second gate 206 may be separated by a portion of insulating region 210. In some embodiments, second gate 206 may be separated from first semiconductor layer 212 by a distance of less than 1000 angstroms, e.g., 100 angstroms. Positioning second gate 206 within 1000 angstroms of first semiconductor layer 212 enhances the control of the electric field in the channel region.

During operation of pHEMT 200, electrons may be conducted through InGaAs channel region 216 between the source 204 and drain 208 in response to a gate signal applied to first gate 205 and second gate 206. In accordance with the invention, the first gate 205 and the second gate 206 may be biased at different DC levels. In particular, the gates may be biased such that the DC voltage of first gate 205 is greater than the voltage of second gate 206 ($V_{g1, DC} > V_{g2, DC}$). Such a biasing configuration may be used for depletion mode FETs, however, for enhancement mode FETs the biasing configuration may be the opposite ($V_{g1, DC} < V_{g2, DC}$).

First gate 205 and second gate 206 may have the same AC voltage applied thereto for modulating the conduction of pHEMT 200. Alternatively, the AC signal may be applied to the two gates in a magnitude ratio that is the same as the ratio of their respective bias voltages, to enhance linearity. However, providing the same AC voltage to both first gate 205 and second gate 206 can reduce the effect of a parasitic capacitance that couples first gate 205 to second gate 206. However, the same AC voltage need not necessarily be applied to both first gate 205 and second gate 206. For example, an AC voltage be applied to only one of the two gates. Such a mode of operation may simplify the design of a circuit that supplies the AC voltage, and may be suitable for relatively low frequencies of operation. An AC signal may be applied to one or more gates in any suitable way, as the invention is not limited in this respect.

The Applicants have appreciated that using at least two independently biased gates in such a configuration enables tailoring the electric field in channel region 216 so that it is substantially uniform. As a result, such a FET may exhibit substantially constant transconductance over a wider range of gate voltages than was previously possible. Furthermore, linearity of the FET and electron mobility may be improved.

As discussed above, FIG. 2 illustrates an example of a pHEMT 200 that has two gates 205 and 206. However, more than two gates may be used, as the invention is not limited in this respect. Providing a transistor with more than two gates may facilitate achieving a uniform electric field in the channel region. For example, three or more gates may be used, and each gate may be biased independently of the other gates.

Figure 3:
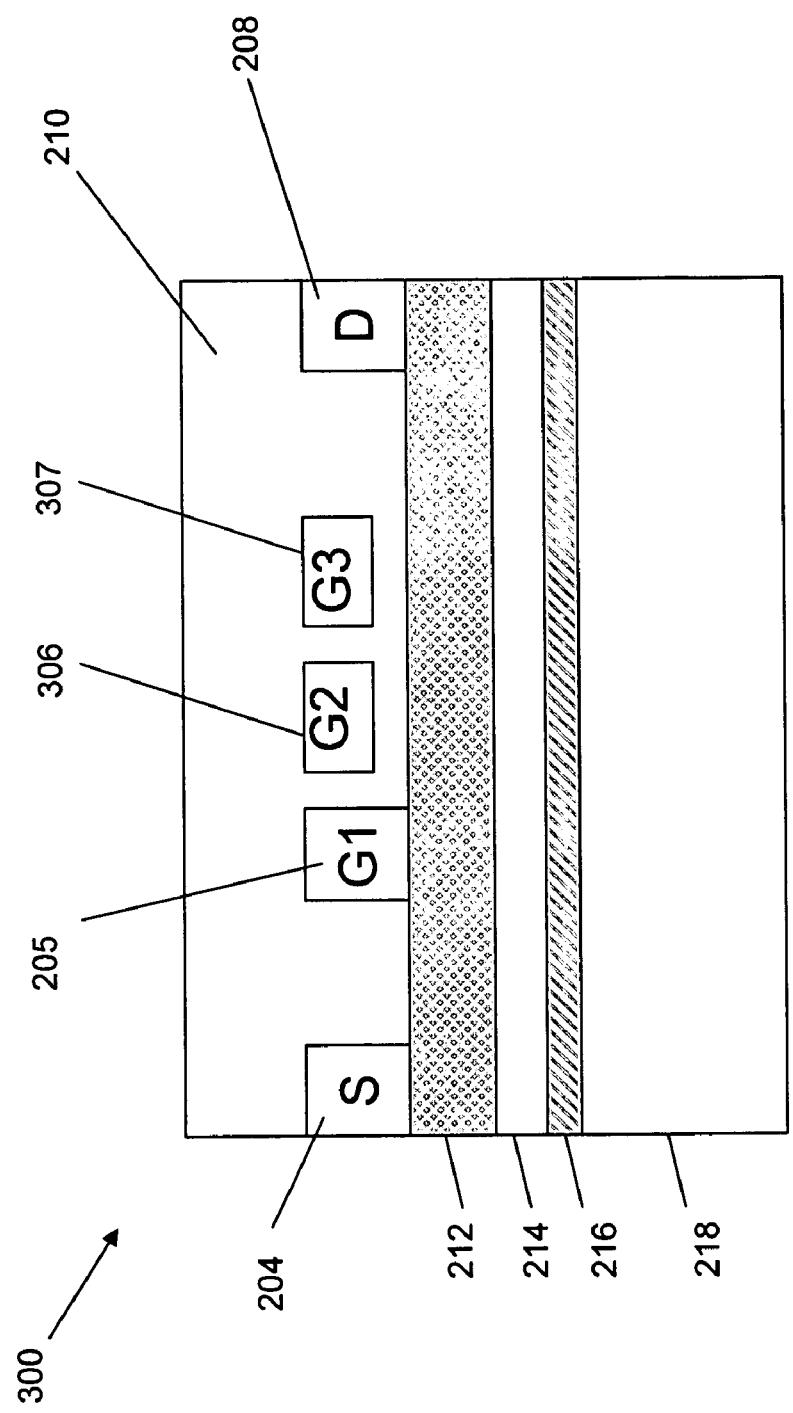
FIG. 3 is a diagram illustrating an example of a cross-section of a pHEMT having three gates, according to another embodiment of the invention.

FIG. 3 is a cross-section of a pHEMT 300 having three gates, according to another embodiment of the invention. In this embodiment, pHEMT 300 includes three gates 205, 306 and 307, each of which may be biased at different DC voltages. For example, the gates may be biased such that the voltage of first gate 205 is greater than the voltage of second gate 306, and the voltage of second gate 306 is greater than that of third gate 307 ($V_{g1, DC} > V_{g2, DC} > V_{g3, DC}$). Such a biasing configuration may be used for depletion mode FETs, however, for enhancement mode FETs the biasing configuration may be the opposite ($V_{g1, DC} < V_{g2, DC} < V_{g3, DC}$).

Each of the three gates 205, 306 and 307 may have the same AC control signal applied thereto for modulating pHEMT 300. However, the same AC voltage need not necessarily be applied to each gate. For example, an AC voltage be applied to only one or two of the three gates. Such a mode of operation may simplify the design of a circuit that supplies the AC voltage, and may be suitable for relatively low frequencies of operation. An AC signal may be applied to one or more gates in any suitable way, as the invention is not limited in this respect. Furthermore, embodiments of the invention may have any suitable number of gates.

The invention is not limited as to the particular materials used for the various regions of the FET. The semiconductor regions may be any suitable semiconductor regions, such as silicon, germanium, gallium arsenide, gallium nitride, etc., as the invention is not limited in this respect. Furthermore, the gate, source and drain metallizations may be formed of any suitable conductive material, e.g., a metal such as aluminum. As discussed above, the insulating regions may be formed of any suitable insulating material, e.g., silicon nitride or silicon dioxide, or a combination of materials.

FIGS. 2 and 3 illustrate examples of pHEMTs according to some embodiments of the invention. However, it should be appreciated the present invention is not limited to pHEMTs, but may be applied to any suitable type of FET, e.g., MOSFETs or MESFETs. Accordingly, another embodiment of the invention will now be described that illustrates how aspects of the invention may be implemented in metal-oxide-semiconductor (MOS) technology.

Figure 4:
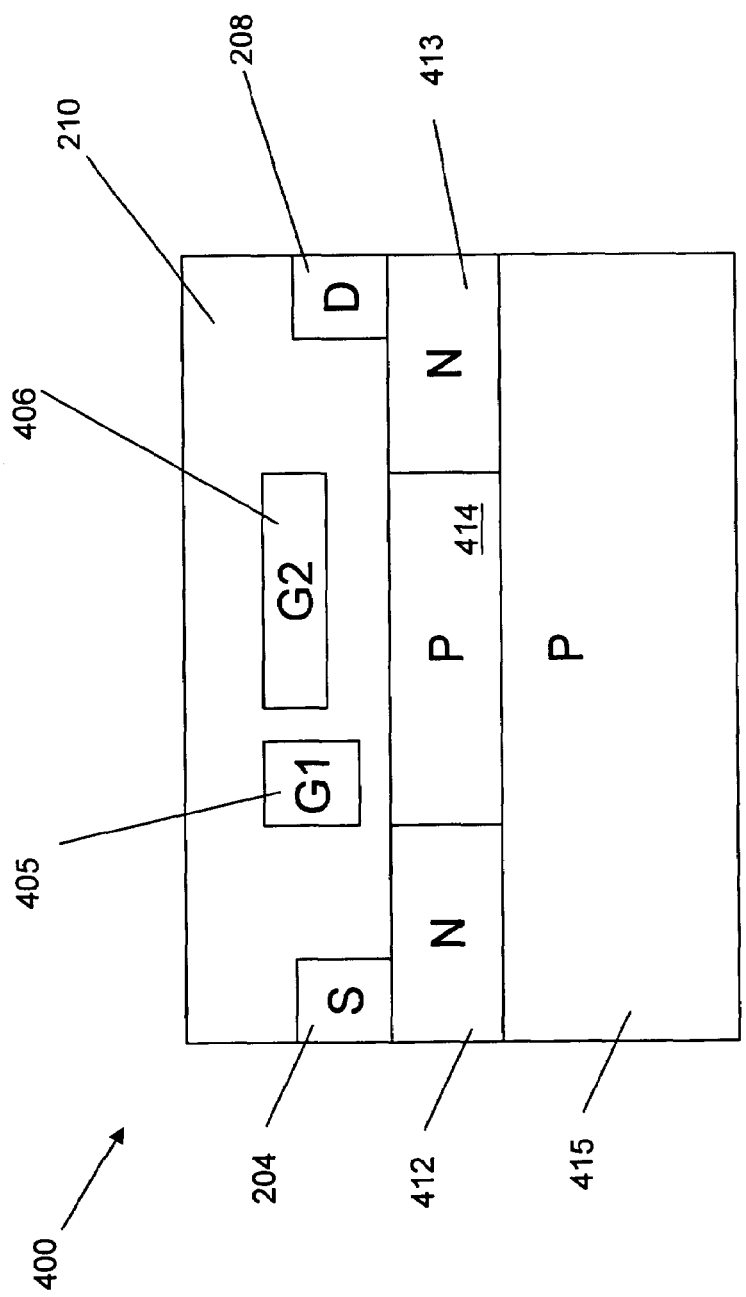
FIG. 4 is a cross-section of a metal-oxide-semiconductor field effect transistor (MOSFET), according to another embodiment of the invention.

FIG. 4 is a cross-section of a metal-oxide-semiconductor field effect transistor 400 (MOSFET), according to another embodiment of the invention. MOSFET 400 may include a source 204, drain 208, first gate 405, second gate 406, insulating region 210, N doped semiconductor regions 412 and 413, and P doped semiconductor regions 414 and 415. Semiconductor regions 412-415 may be regions of any suitable semiconductor material, e.g., silicon. Source 204, drain 208, first gate 405 and second gate 406 may be metallizations formed of any suitable material, e.g., polysilicon, or a metal such as aluminum. Source 204, drain 208, first gate 405 and second gate 406 may be separated by an insulating region 210 which may be any suitable insulating material, such as silicon nitride or silicon dioxide. Although FIG. 4 illustrates an example of an N-channel MOSFET, it should be appreciated that the invention is not limited in this respect, as aspects of the invention may be implemented in a P-channel MOSFET or any other suitable FET.

First gate 405 and second gate 406 may be separated from semiconductor regions 412-415 by insulation region 210. First gate 405 may be positioned closer to source 204 than second gate 406, which may be positioned closer to drain 208 than first gate 405. In this embodiment, first gate 405 is positioned closer to the channel region of MOSFET 400, e.g., a portion of semiconductor region 414, than second gate 406. Positioning first gate 405 closer to the region 414 than second gate 406 allows shaping the electric field in the channel region so that is substantially uniform.

Figure 5:
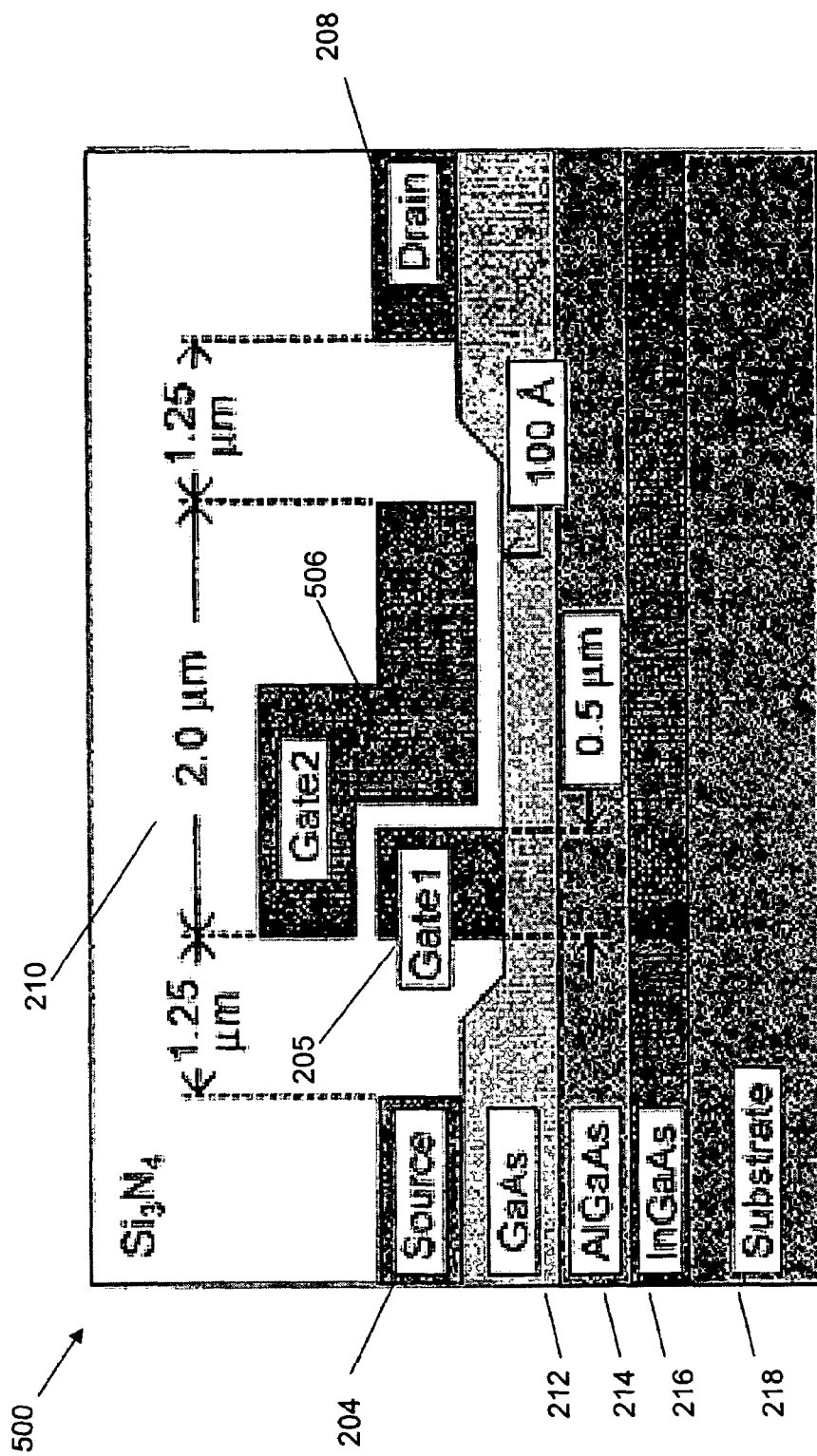
FIG. 5 is a cross-section of a pHEMT, including an overlapping gate structure, according to another embodiment of the invention.

FIG. 5 is a cross-section of a pHEMT 500 according to another embodiment of the invention. In this embodiment, second gate 506 includes a portion that is above first gate 205 and a portion that is on one side of first gate 205. Such an overlapping gate structure controls the parasitic capacitance between first gate 205 and second gate 506 by controlling the thickness of insulating region 210 between first gate 205 and second gate 506. The thickness of the insulating region 210 between first gate 205 and second gate 506 may be, for example, approximately 100 angstroms. As discussed above, first gate 205 may be biased at a higher DC voltage than second gate 506, yet both first gate 205 and second gate 506 may have the same AC voltage applied thereto for modulating pHEMT 500. As one example, first gate 205 may be biased approximately 0.6 volts higher than second gate 506.

By way of example, FIG. 5 illustrates dimensions of various features of pHEMT 500 according to one embodiment of the invention. In this embodiment, the first gate 205 and the second gate 506 may be positioned approximately 1.5 μm from source 204 in the lateral dimension, e.g., parallel to a wafer surface. A portion of the second gate may be positioned approximately 1.5 μm from drain 208 in the lateral dimension. First gate 205 may extend approximately 0.5 μm in the lateral dimension, and second gate 506 may extend approximately 2.0 μm in the lateral dimension. These dimensions are provided merely by way of example, and are not intended to be limiting. One of ordinary skill in the art would appreciate that the FET may be of any suitable size, and that the dimensions may be scaled accordingly. However, different dimensions and/or relative sizes between dimensions may be used, as the invention is not limited in this respect. For larger devices, the difference between the DC bias voltages on first gate 205 and second gate 506 may be increased to maintain a uniform electric field in the channel region.

As discussed above, some embodiments of the invention are directed to a FET that provides substantially constant transconductance. As used herein, transconductance is the ratio of the change in drain current to the change in gate-source voltage of the FET. Substantially constant transconductance means that the transconductance of the FET does not vary substantially over a range of gate voltages. Furthermore, the transconductance can be substantially constant across a range of frequencies.

Figure 6:
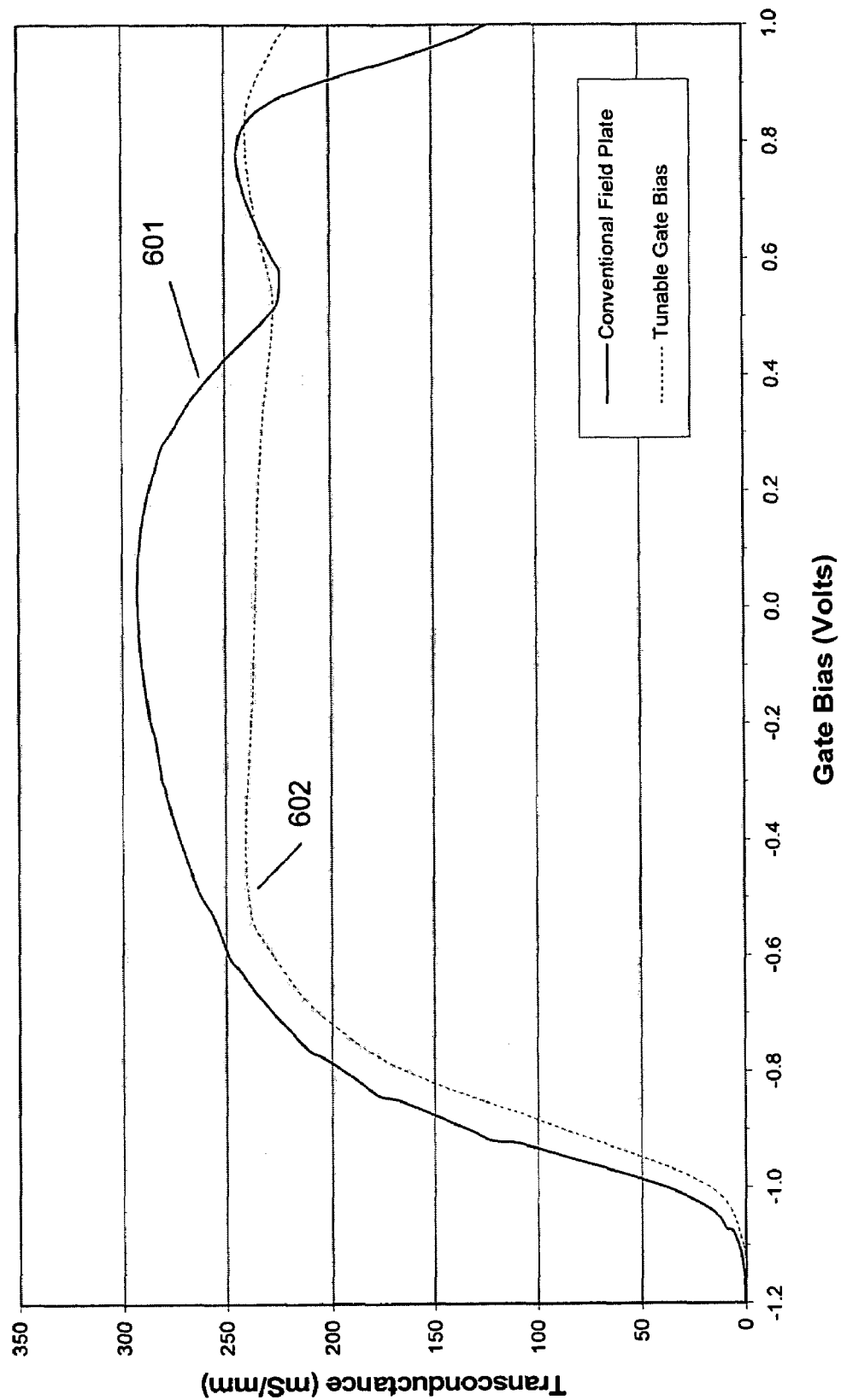
FIG. 6 is a diagram illustrating examples of curves that represent the transconductance of FETs for a range of gate voltages.

FIG. 6 is a diagram illustrating examples of curves 601 and 602 that represent the transconductance of two different FETs for a range of gate voltages. Curve 601 represents the transconductance for a conventional FET that uses a field plate in an attempt to provide a uniform electric field in the channel region. Curve 601 illustrates that the transconductance of this conventional FET reaches nearly 300 mS/mm, before dropping rapidly at approximately 0.3 V of gate bias. Such a non-constant transconductance may lead to non-linearity, e.g., some voltages being amplified at a higher level than other voltages.

Curve 602 illustrates the modeled transconductance that may be achieved for a FET according to the embodiment of the invention illustrated in FIG. 5. Curve 602 shows that the transconductance of the FET does not vary significantly (e.g., less than 25 mS/mm peak-to-peak) over the range of −0.6 V to 1.0 V gate voltage. Such a substantially constant transconductance provides improved performance and substantially linear operation of the FET over this range of operating voltages on the gate.

In the above-described embodiments, gates were positioned and biased to increase the electrical field near the source and decrease the electrical field near the drain, so that the electrical field would be substantially uniform throughout the channel. However, in some circumstances, the electric field may be large near the source and small near the drain. Such a situation may arise, for example, for a MESFET in enhancement mode. In such a situation, obtaining a uniform electric field may require decreasing the electric field near the source and increasing the electric field near the drain. To achieve a uniform electric field in such a scenario, the orientation of the above-described embodiments may be altered such that the positions of the drain and the source are reversed, for example.

Having thus described several aspects of at least one embodiment of the invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A field effect transistor that operates with substantially constant transconductance by controlling an electric field in a channel of the field effect transistor using a first gate biased at a first DC voltage and a second gate biased at a second DC voltage.

2. The field effect transistor of claim 1, wherein the field effect transistor operates with substantially constant transconductance for a range of gate bias voltages spanning at least one volt.

3. The field effect transistor of claim 2, wherein the substantially constant transconductance varies by no more than 25 mS/mm over the range of gate bias voltages.

4. The field effect transistor of claim 1, comprising:
a channel region in which the channel is formed;
the first gate and the second gate, wherein the second gate is positioned farther from the channel region tan the first gate.

5. The field effect transistor of claim 4, wherein the first DC voltage is greater than the second DC voltage.

6. The field effect transistor of claim 4, further comprising:
a source; and
a drain;
wherein the first gate is positioned closer to the source than to the drain.

7. The field effect transistor of claim 4, further comprising:
a semiconductor region;
wherein the first gate forms a Schottky contact with the semiconductor region.

8. The field effect transistor of claim 4, further comprising:
a semiconductor region;
wherein the second gate is positioned within approximately 1000 angstroms of the semiconductor region.

9. The field effect transistor of claim 8, wherein the second gate is positioned within approximately 100 angstroms of the semiconductor region.

10. The field effect transistor of claim 4, wherein the field effect transistor is a high-electron-mobility transistor.

11. The field effect transistor of claim 4, wherein the field effect transistor is a metal-oxide-semiconductor field effect transistor.

12. The field effect transistor of claim 1, comprising:
a source;
a drain;
a semiconductor region;
the first gate, wherein the first ate contacts the semiconductor region; and
the second gate, wherein the second gate is separated from the semiconductor region by an insulating region;
wherein the second DC voltage is lower than the first DC voltage.

13. The field effect transistor of claim 12, wherein the field effect transistor is a high-electron-mobility transistor.

14. The field effect transistor of claim 12, wherein the second gate is separated from the semiconductor region by less than approximately 1000 angstroms of the insulating region.

15. The field effect transistor of claim 14, wherein the second gate is separated from the semiconductor region by approximately 100 angstroms or less of the insulating region.

16. The field effect transistor of claim 12, wherein at least a portion of the second gate is positioned above the first gate.

17. The field effect transistor of claim 12, wherein the first gate is positioned closer to the source than the second gate.

18. The field effect transistor of claim 12, wherein the second gate is positioned closer to the drain than the first gate.

19. The field effect transistor of claim 12, wherein the first gate is separated from both the first gate and the semiconductor region by a same distance of approximately 100 angstroms or less of the insulating region.

20. The field effect transistor of claim 12, further comprising a third gate biased at a third DC voltage and separated from the semiconductor region by an insulating region.

* * * * *

UNITED STATES PATENT AND TRADEMARK OFFICE
CERTIFICATE OF CORRECTION

PATENT NO. : 7,629,627 B2 Page 1 of 1
APPLICATION NO. : 11/406838
DATED : December 8, 2009
INVENTOR(S) : Mil'shtein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 507 days.

Signed and Sealed this

Second Day of November, 2010

David J. Kappos
*Director of the United States Patent and Trademark Office*